(12) United States Patent
Niki

(10) Patent No.: US 10,720,576 B2
(45) Date of Patent: Jul. 21, 2020

(54) SEMICONDUCTOR DEVICE

(71) Applicant: Toshiba Memory Corporation, Minato-ku (JP)

(72) Inventor: Yusuke Niki, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/281,207

(22) Filed: Feb. 21, 2019

(65) Prior Publication Data

US 2020/0091421 A1    Mar. 19, 2020

(30) Foreign Application Priority Data

Sep. 18, 2018 (JP) .................................. 2018-174085

(51) Int. Cl.
*G11C 8/00* (2006.01)
*H01L 45/00* (2006.01)
(Continued)

(52) U.S. Cl.
CPC ............ *H01L 45/08* (2013.01); *G11C 13/003* (2013.01); *G11C 13/0026* (2013.01);
(Continued)

(58) Field of Classification Search
CPC ............ G11C 13/0026; G11C 13/0028; G11C 13/003; H01L 45/08; H01L 27/2481; H01L 45/1233; H01L 45/1266
See application file for complete search history.

(56) References Cited

U.S. PATENT DOCUMENTS 8,472,272 B2 * 6/2013 Kajigaya .................. G11C 7/02
                                                    365/203
8,659,327 B2 * 2/2014 Lin ........................ H03K 17/10
                                                    327/108
(Continued)

FOREIGN PATENT DOCUMENTS

JP        2017-055082        3/2017

*Primary Examiner* — Pho M Luu
(74) *Attorney, Agent, or Firm* — Oblon, McClelland, Maier & Neustadt, L.L.P.

(57) ABSTRACT

A semiconductor device includes: a first switch that uses a first selection signal and a second selection signal to select one of a first voltage and a third voltage or a second voltage and a fourth voltage from the first voltage, the second voltage lower than the first voltage, the third voltage lower than the first voltage, and the fourth voltage lower than the third voltage; a second switch that selects one of a first input signal or a second input signal from the first input signal being the first voltage or the third voltage and the second input signal being the second voltage or the fourth voltage; a third switch that outputs the third voltage in a case where the first voltage and the third voltage are selected by the first switch and the first input signal, which is the first voltage, is selected by the second switch, outputs the first voltage in a case where the first voltage and the third voltage are selected by the first switch and the first input signal, which is the third voltage, is selected by the second switch, outputs the second voltage in a case where the second voltage and the fourth voltage are selected by the first switch and the second input signal, which is the second voltage, is selected by the second switch, and outputs the fourth voltage in a case where the second voltage and the fourth voltage are selected by the first switch and the second input signal, which is the fourth voltage, is selected by the second switch; a fourth switch that outputs the first voltage in a case where the third voltage is output from the third switch, outputs the third voltage in a (Continued)

case where the first voltage is output from the third switch, outputs the fourth voltage in a case where the second voltage is output from the third switch, and outputs the second voltage in a case where the fourth voltage is output from the third switch; and a control circuit that controls the first switch, the second switch, the third switch and the fourth switch.

9 Claims, 15 Drawing Sheets

(51) Int. Cl.
      *H01L 27/24*       (2006.01)
      *G11C 13/00*       (2006.01)

(52) U.S. Cl.
      CPC ...... *G11C 13/0028* (2013.01); *H01L 27/2481* (2013.01); *H01L 45/1233* (2013.01); *H01L 45/1266* (2013.01)

(56) References Cited

U.S. PATENT DOCUMENTS

| | | | |
|---|---|---|---|
| 9,496,042 B1 * | 11/2016 | Abiko | ................... G11C 16/10 |
| 9,947,866 B2 | 4/2018 | Takahashi | |
| 2017/0077100 A1 | 3/2017 | Takahashi | |

* cited by examiner

• Well Switch

• Input Switch

• Output Switch

SEMICONDUCTOR DEVICE

CROSS-REFERENCE TO RELATED APPLICATION

This application is based upon and claims the benefit of priority from Japanese Patent Application No. 2018-174085, filed on Sep. 18, 2018, the entire contents of which are incorporated herein by reference.

FIELD

Embodiments described herein relate generally to a semiconductor device.

BACKGROUND

A cross-point memory device using a variable resistive element as a memory cell array has been attracting attention owing to a possibility to realize a large-capacity storage device more easily than conventional ones.

In the cross-point memory device, a large number of wires called bit lines and word lines are arranged crossing each other, and memory cells are formed at the intersections of the bit lines and the word lines. Write operation to a memory cell is performed by applying a voltage or a current to the bit line and the word line connected to the cell.

DETAILED DESCRIPTION

Figure 1:
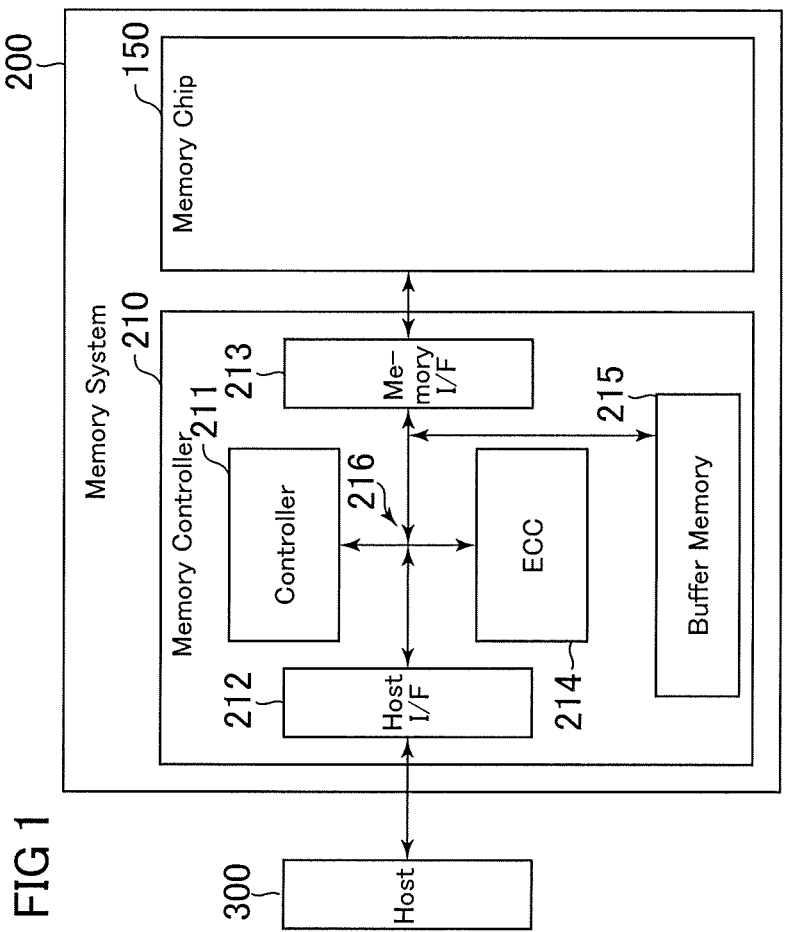
FIG. 1 is a block diagram showing the configuration of a memory system according to an embodiment.

Hereinafter, embodiments will be described using the drawings. Note that the same or similar reference signs denote the same or similar parts in the drawings.

In this specification, in order to indicate the positional relationship between components and the like, the upward direction in the drawing is described as "upper," and the downward direction in the drawing is described as "lower." In this specification, the concepts of "upper" and "lower" are not necessarily terms indicating the relationship with the direction of gravity.

Embodiments

A semiconductor device according to an embodiment includes: a first switch that uses a first selection signal and a second selection signal to select one of a first voltage and a third voltage or a second voltage and a fourth voltage from the first voltage, the second voltage lower than the first voltage, the third voltage lower than the first voltage, and the fourth voltage lower than the third voltage; a second switch that selects one of a first input signal or a second input signal from the first input signal being the first voltage or the third voltage and the second input signal being the second voltage or the fourth voltage; a third switch that outputs the third voltage in a case where the first voltage and the third voltage are selected by the first switch and the first input signal, which is the first voltage, is selected by the second switch, outputs the first voltage in a case where the first voltage and the third voltage are selected by the first switch and the first input signal, which is the third voltage, is selected by the second switch, outputs the second voltage in a case where the second voltage and the fourth voltage are selected by the first switch and the second input signal, which is the second voltage, is selected by the second switch, and outputs the fourth voltage in a case where the second voltage and the fourth voltage are selected by the first switch and the second input signal, which is the fourth voltage, is selected by the second switch; a fourth switch that outputs the first voltage in a case where the third voltage is output from the third switch, outputs the third voltage in a case where the first voltage is output from the third switch, outputs the fourth voltage in a case where the second voltage is output from the third switch, and outputs the second voltage in a case where the fourth voltage is output from the third switch; and a control circuit that controls the first switch, the second switch, the third switch and the fourth switch.

FIG. 1 is a block diagram showing the configuration of a memory system 200 according to an embodiment. The memory system 200 is connected to a host 300 and functions as an external storage device for the host 300. The host 300 is, for example, a server, a personal computer, a mobile information processing device, and so forth.

The memory system 200 has a memory chip 150 and a memory controller 210. The memory controller 210 controls the memory chip 150 in response to a request from the host 300 or autonomously.

The memory controller 210 has a controller 211, a host interface (I/F) 212, a memory interface (I/F) 213, an error correction circuit (ECC) 214, a buffer memory 215 and a bus 216. The controller 211, the host I/F 212, the memory I/F 213, the ECC 214, and the buffer memory 215 are connected to each other via the bus 216. The controller 211 is, for example, a central processing unit (CPU) and controls each unit in the memory controller 210. The host I/F 212 mediates the communication with the host 300. The memory I/F 213 mediates the transmission of data and instructions to and from the memory chip 150. The ECC 214 performs error correction processing on the data read out from the memory chip 150. The buffer memory 215 buffers the data and instructions transmitted to and from the memory chip 150. The buffer memory 215 is also used as a work area of the controller 211.

Figure 2:
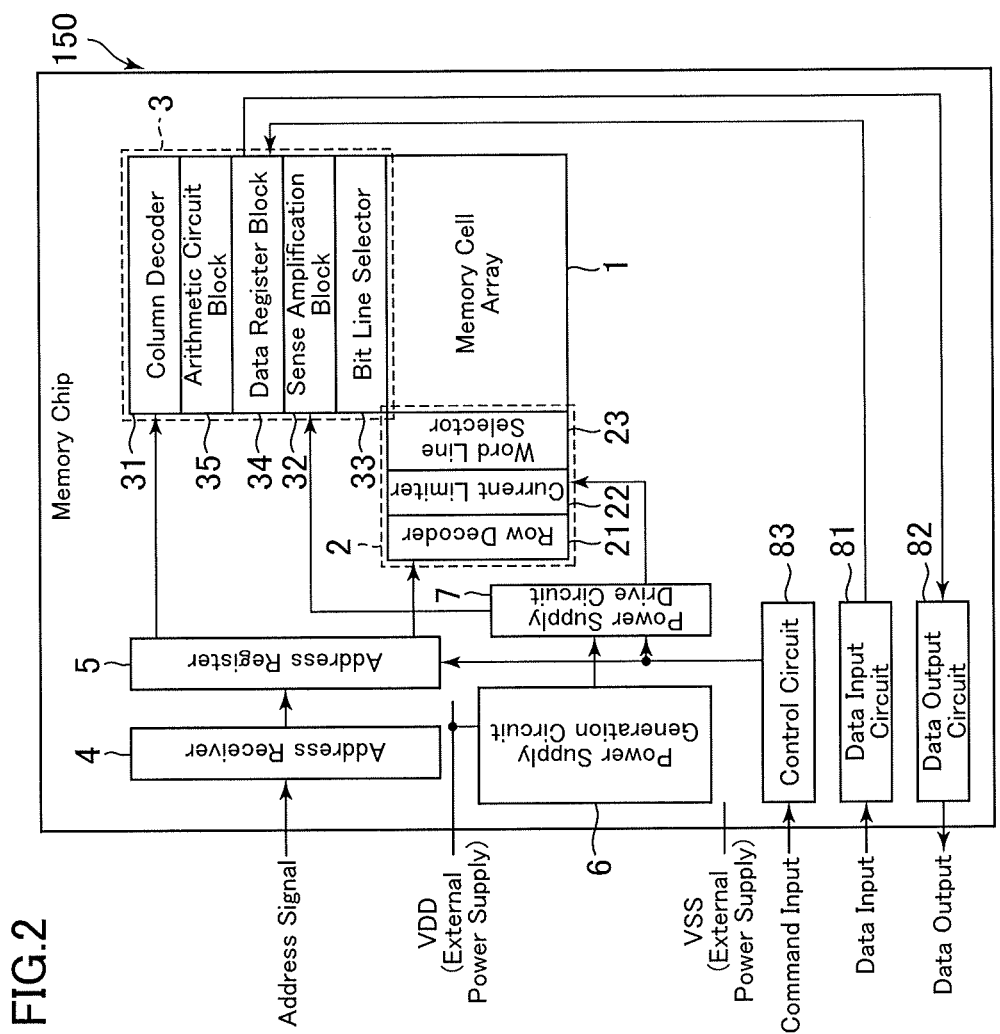
FIG. 2 is a block diagram showing the configuration of the memory chip according to the embodiment.

FIG. 2 is a block diagram showing the configuration of the memory chip 150 according to the embodiment.

The memory chip 150 has a memory cell array 1, a row circuit 2, a column circuit 3, an address receiver 4, an address register 5, a power supply generation circuit 6, a power supply drive circuit 7, a control circuit 83, a data input circuit 81 and a data output circuit 82.

Figure 3:
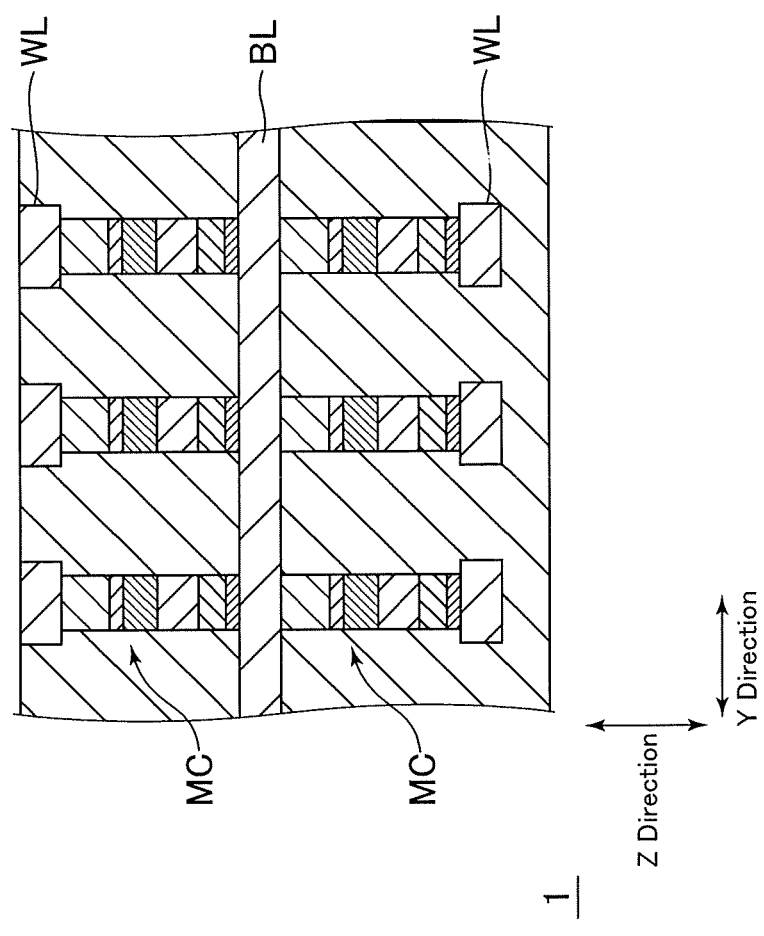
FIG. 3 is a sectional view of the memory cell array according to the embodiment.
Figure 4:
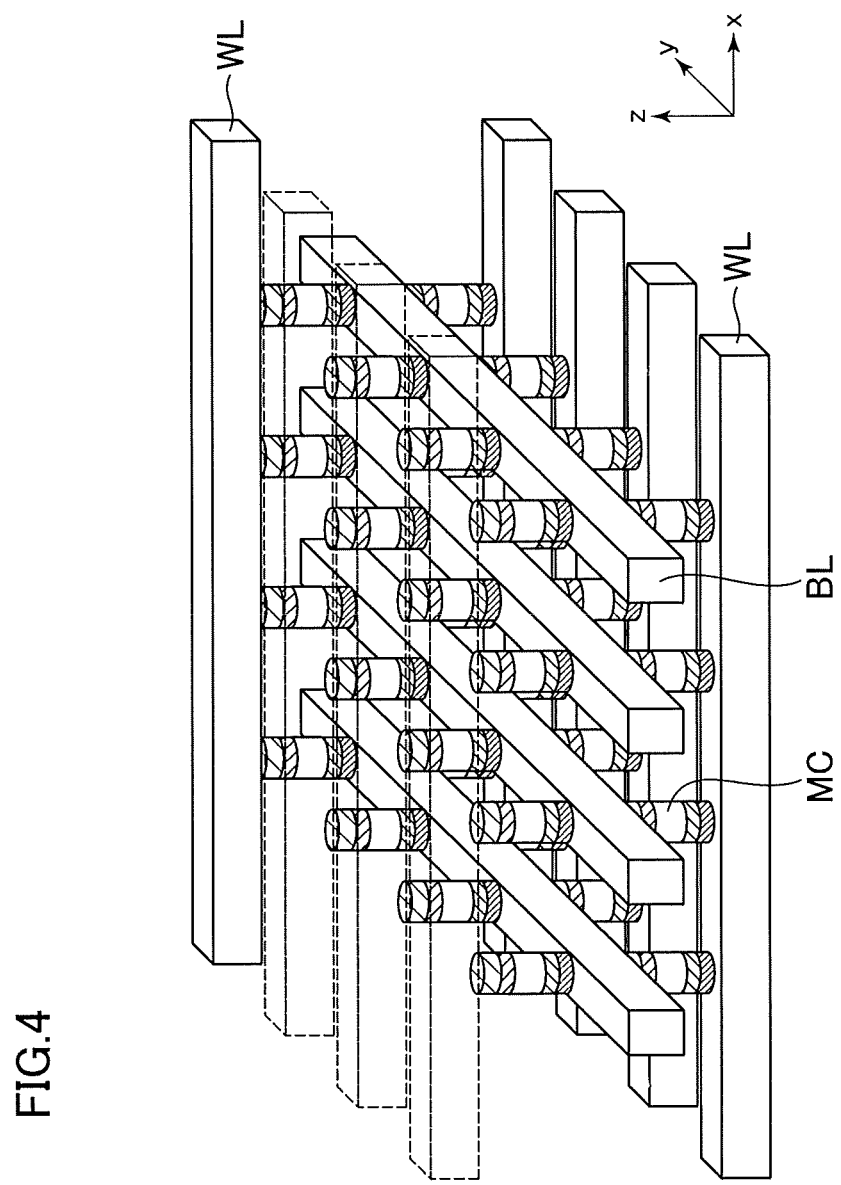
FIG. 4 is a perspective view of the memory cell array according to the embodiment.

FIG. 3 is a sectional view of the memory cell array 1 according to the embodiment. FIG. 4 is a perspective view of the memory cell array 1 according to the embodiment.

The memory cell array 1 is a cross-point memory device having variable resistive memory cells MC. The memory cell array 1 is, for example, formed on a silicon substrate (not shown) via an interlayer insulation film (not shown).

Word lines WL and bit lines BL are made of, for example, tungsten. The word lines WL and the bit lines BL are alternately placed at predetermined intervals in the vertical direction (Z direction). The word lines WL extend, for example, in the X direction. Each of the word lines WL is placed at a predetermined interval in the Y direction. The bit lines BL extend, for example, in the Y direction. Each of the bit lines BL is placed at a predetermined interval in the X direction. As shown in FIG. 4, the word lines WL and the bit lines BL are placed in the directions crossing each other.

The memory cells MC are formed at the respective intersections of the word lines WL and the bit lines BL adjacent in the Z direction. FIG. 3 shows an example in which three memory cells MC are formed between the bit line BL at the center of FIG. 3 and the three word lines WL provided above and under the bit line BL.

Note that the number of memory cell MC layers, the number of word lines WL and the number of bit lines BL are not limited to those described above.

Figure 5A:
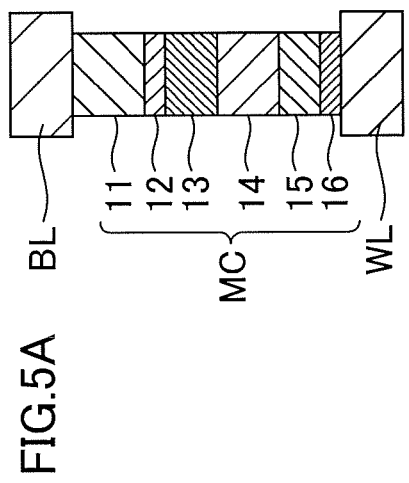
FIGS. 5A and 5B are sectional views of the memory cell according to the embodiment.
Figure 5B:
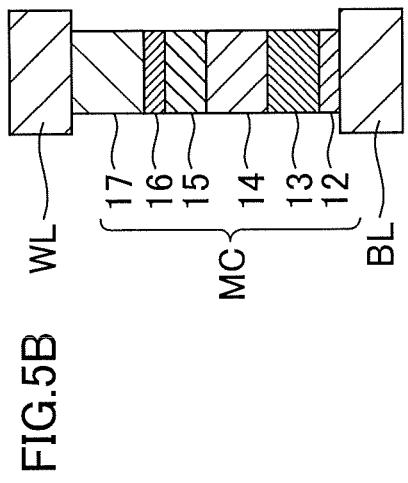

FIGS. 5A and 5B are sectional views of the memory cell MC according to the embodiment. The memory cell MC is a nonvolatile variable resistive memory cell, for example, a conductive bridging random access memory (CERAM). FIG. 5A is a sectional view showing the cross-section structure of the memory cell MC formed between the bit line BL and the word line WL placed under the bit line BL. FIG. 5B is a sectional view showing the cross-section structure of the memory cell MC formed between the bit line BL and the word line WL placed above the bit line BL.

The memory cell MC in FIG. 5A has a structure in which a bit line contact metal layer 11, a barrier metal layer 12, an ion source electrode 13, an ion diffusion layer 14, a counter electrode 15, and a barrier metal layer 16 are stacked between the bit line BL and the word line WL in order from the bit line BL.

The memory cell MC in FIG. 5B has a structure in which a word line contact metal layer 17, the barrier metal layer 16, the counter electrode 15, the ion diffusion layer 14, the ion source electrode 13, and the barrier metal layer 12 are stacked between the bit line BL and the word line WL in order from the word line WL.

The ion source electrode 13 contains, for example, a metallic element such as copper (Cu), silver (Ag), aluminum (Al), cobalt (Co), or nickel (Ni).

The ion diffusion layer 14 has a structure which enables electrodiffusion of the ionized metallic element at the ion source electrode 13. The ion diffusion layer 14 includes, for example, amorphous silicon, a silicon oxide film, a silicon nitride film, or transition metal oxide.

In the initial state of the memory cell MC, the metal ions are not moved from the ion source electrode 13 to the ion diffusion layer 14 so that there is a high resistive state (OFF) between the ion source electrode 13 and the counter electrode 15.

Next, a set voltage (writing voltage), which is a relatively high voltage, is applied between the ion source electrode 13 and the counter electrode 15. That is, a positive voltage is applied to the ion source electrode 13, and a negative voltage is applied to the counter electrode 15. At this time, the metal ions are moved from the ion source electrode 13 to the ion diffusion layer 14. Accordingly, there is a low resistive state (ON) where the resistance between the ion source electrode 13 and the counter electrode 15 is lowered.

On the other hand, when a relatively high voltage (reset voltage) in the direction opposite to the set voltage is applied, the metal ions are moved in the opposite direction, and the state returns to the original high resistive state (OFF).

Moreover, when a relatively low voltage in the direction opposite to the set voltage is applied in the above low resistive state, the metal ions are moved toward the ion source electrode 13, and the state becomes the high resistive state (OFF). Herein, when a voltage is applied in the same direction as the set direction, the metal ions are moved toward the counter electrode 15, and the state returns to the low resistive state (ON).

Thus, the memory cell MC functions as a switching element having rectification property. Furthermore, in a case where an n-type semiconductor is used for the counter electrode 15, a portion of the counter electrode 15 in contact with the ion diffusion layer 14 is depleted in a state where a voltage is applied opposite to the setting direction. Therefore, strong rectification property is obtained.

Figure 6:
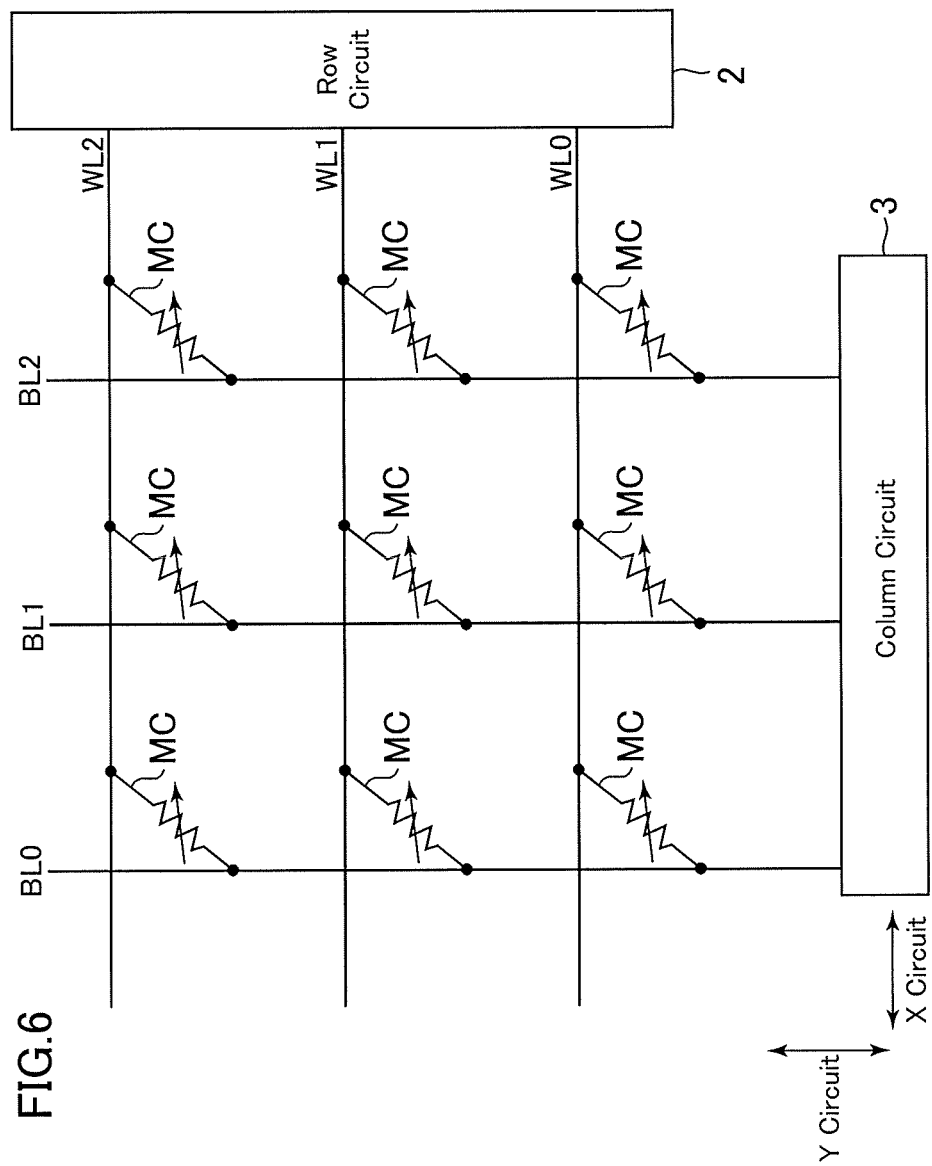
FIG. 6 is a circuit diagram of a main part of the memory cell according to the embodiment.

FIG. 6 is a circuit diagram of a main part of the memory cell according to the embodiment.

The word lines WL are connected to the row circuit 2, and the bit lines BL are connected to the column circuit 3. Then, the memory cells MC are formed at the respective intersections of the word lines WL and the bit lines BL.

Figure 7:
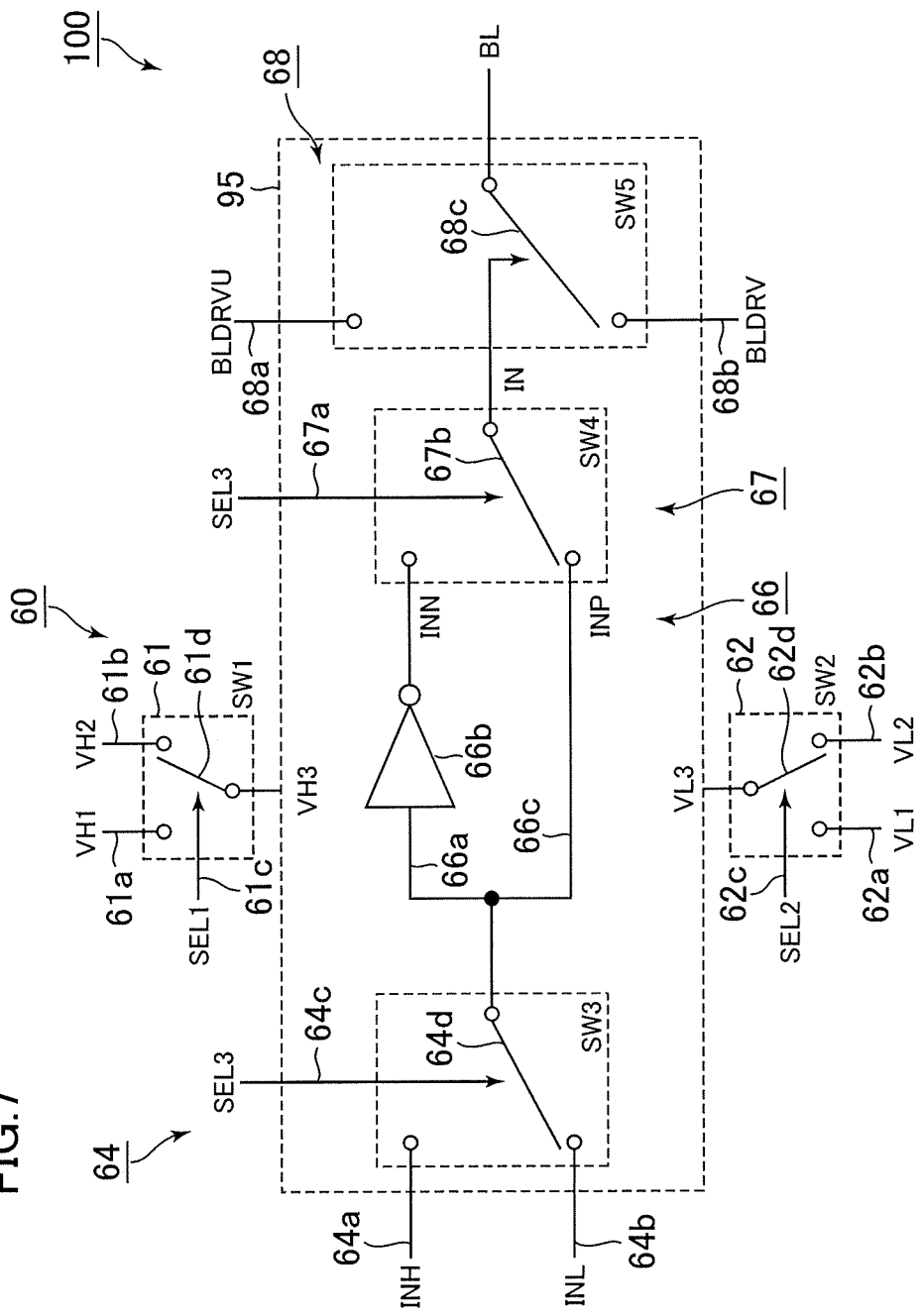
FIG. 7 is a circuit diagram of a semiconductor device of one aspect of the embodiment.

FIG. 7 is a circuit diagram of a semiconductor device 100 of one aspect of the embodiment.

For example, the semiconductor device 100 corresponds to a column decoder 31 and a bit line selector 33 in FIG. 2, and FIG. 7 shows an example in which a voltage is supplied to the bit line BL by using the semiconductor device 100.

The semiconductor device 100 has a well switch (first switch) 60 and an operation circuit 95. The operation circuit 95 includes an input switch (second switch) 64, a NOT part 66, an output switch (third switch) 67 and a multiplexer (fourth switch) 68.

The well switch 60 has a first well switch circuit 61 and a second well switch circuit 62. The first well switch circuit 61 has a first voltage supply line 61a, a second voltage supply line 61b, a first selection signal supply line 61c, and a switch 61d for the first well switch.

The second well switch circuit 62 has a third voltage supply line 62a, a fourth voltage supply line 62b, a second selection signal supply line 62c, and a switch 62d for the second well switch.

Using a first selection signal (SEL1) and a second selection signal (SEL2), the well switch 60 selects one of a first voltage and a third voltage or a second voltage and a fourth voltage. Note that the second voltage is lower than the first voltage, and the fourth voltage is lower than the third voltage. As one example, the first well switch circuit 61 and the second well switch circuit 62 operate as follows.

Using the first selection signal (SEL1) supplied from the first selection signal supply line 61c, the first well switch circuit (SW1) 61 selects the first voltage (VH1) or the second voltage (VH2) by the switch 61d for the first well switch. The first voltage (VH1) is supplied from the first voltage supply line 61a, and the second voltage (VH2) is supplied from the second voltage supply line 61b. The first selection signal (SEL1) is used to control the switch 61d for the first well switch.

Using the second selection signal (SEL2) supplied from the second selection signal supply line 62c, the second well switch circuit (SW2) 62 selects the third voltage (VL1) or the fourth voltage (VL2) by the switch 62d for the second well switch. The third voltage (VL1) is supplied from the third voltage supply line 62a, and the fourth voltage (VL2) is supplied from the fourth voltage supply line 62b. The second selection signal (SEL2) is used to control the switch 62d for the second well switch.

The well switch 60 is, in other words, a switch for supplying power to operate the operation circuit 95.

The input switch 64 has a first input signal supply line 64a, a second input signal supply line 64b, a third selection signal supply line 64c and a switch 64d for the input switch.

Using a third selection signal (SEL3) supplied from the third selection signal supply line 64c, the input switch 64 selects a first input signal (INH) or a second input signal (INL) by the switch 64d for the input switch (SW3). The first input signal (INH) is supplied from the first input signal supply line 64a, and the second input signal (INL) is supplied from the second input signal supply line 64b. The third selection signal (SEL3) is used to control the switch 64d for the input switch.

The first input signal (INH) is preferably, for example, the first voltage or the third voltage so that additional separation of the power supply domains is unnecessary and the circuit configuration is simplified. Moreover, the second input signal (INL) is preferably, for example, the second voltage or the fourth voltage so that additional separation of the power supply domains is unnecessary and the circuit configuration is simplified. However, the first input signal (INH) and the second input signal (INL) are not limited as described above.

The NOT part 66 has a first NOT part wire 66a, an INV circuit 66b and a second NOT part wire 66c.

The first NOT part wire 66a and the second NOT part wire 66c are connected to the switch 64d for the input switch. Accordingly, the first input signal (INH) or the second input signal (INL) is supplied to the first NOT part wire 66a and the second NOT part wire 66c. Since the INV circuit 66b is connected to the first NOT part wire 66a, the logical value of the first input signal (INH) or the second input signal (INL) is reversed and output to the portion indicated by "INN" in FIG. 7. On the other hand, since an INV circuit is not connected to the second NOT part wire 66c, the logical value of the first input signal or the second input signal is output directly to a portion indicated by "INP" in FIG. 7.

The output switch 67 has a fourth selection signal supply line 67a and a switch 67b for the output switch (SW4).

The fourth selection signal supply line 67a supplies the third selection signal (SEL3). Then, using the third selection signal (SEL3), either the signal output to "INN" or "INP" is selected by the switch 67b for the output switch.

The multiplexer 68 is a switch having a role of, for example, selecting a BLDRV line 68b described on the lower side of the drawing of FIG. 7 in a case where a signal with the logical value of "1" is supplied, and selecting a BLDRVU line 68a described on the upper side of the drawing of FIG. 7 in a case where a signal with the logical value of "0" is supplied. The signal supplied to the BLDRVU line 68a or the BLDRV line 68b, which is selected by the multiplexer 68 as appropriate, is supplied to the bit line BL.

FIGS. 8 to 11 are examples of the operation of the semiconductor device 100 of one aspect of the embodiment.

Figure 8:
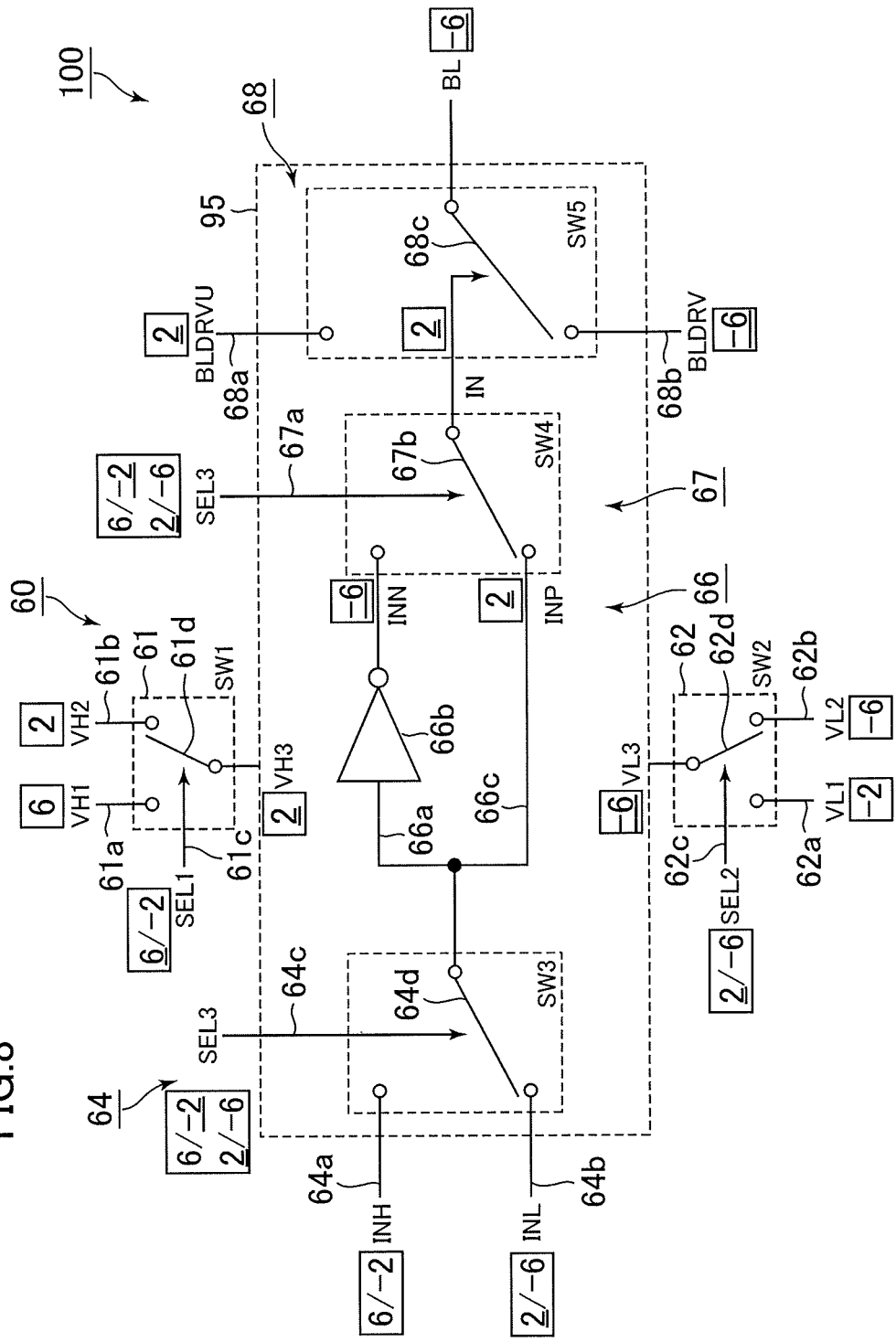
FIG. 8 is one example of the operation in the circuit diagram of the semiconductor device of one aspect of the embodiment.

Description is made using FIG. 8. The first selection signal (SEL1) is +6 V or −2 V. In FIG. 8, +6 V is selected as the first selection signal (SEL1). Therefore, +6 V is supplied by the first selection signal supply line 61c.

By the signal of +6 V supplied from the first selection signal supply line 61c, the switch 61d for the first well switch selects VH2 (the second voltage, +2 V) from VH1 (the first voltage, +6 V) and VH2 (the second voltage, +2 V). Accordingly, +2 V is supplied as one operating voltage (VH3) of the operation circuit 95.

The first selection signal (SEL1) is preferably equal to the first voltage or the third voltage so that the circuit configuration is simplified.

The second selection signal (SEL2) is +2 V or −6 V. In FIG. 8, +2 V is selected as the second selection signal (SEL2). The signal of +2 V is supplied by the second selection signal supply line 62c.

By the signal of +2 V supplied from the second selection signal supply line 62c, the switch 62d for the second well switch selects VL2 (the fourth voltage, −6 V) from VL1 (the third voltage, −2 V) and VL2 (the fourth voltage, −6 V). Accordingly, −6 V is supplied as one operating voltage (VL3) of the operation circuit 95.

The second selection signal (SEL2) is preferably equal to the second voltage or the fourth voltage so that the circuit configuration is simplified.

The first input signal supply line 64a supplies the first voltage (+6 V) or the third voltage (−2 V) as the first input signal (INH). The second input signal supply line 64b supplies the second voltage (+2 V) or the fourth voltage (−6 V) as the second input signal (INL). In FIG. 8, the second voltage (+2 V) is supplied as the second input signal (INL).

The third selection signal (SEL3) supplied by the third selection signal supply line 64c is the first voltage (+6 V) or the third voltage (−2 V) and the second voltage (+2 V) or the fourth voltage (−6 V). In FIG. 8, the third voltage (−2 V) and the second voltage (+2 V) are supplied as the third selection signal (SEL3). Accordingly, the switch 64d for the input switch selects the second input signal (INL).

The second voltage (+2 V), which is the second input signal (INL) passed through the first NOT part wire 66a and the INV circuit 66b of the NOT part 66, becomes the fourth voltage (−6 V) and is supplied to the portion "INN" in FIG. 8. On the other hand, the second voltage (+2 V), which is the second input signal (INL) passed through the second NOT part wire 66c, is directly output as the second voltage (+2 V) to the portion "INP" in FIG. 8.

The fourth selection signal supply line 67a of the output switch 67 supplies the third voltage (−2 V) and the second voltage (+2 V), which are the third selection signal (SEL3). Accordingly, the switch 67b for the output switch (SW4) selects "INP." The second voltage (+2 V) supplied to "INP" is supplied to the multiplexer 68.

For example, the second voltage (+2 V) is supplied to the BLDRVU line 68a of the multiplexer 68. On the other hand, for example, the fourth voltage (−6 V) is supplied to the BLDRV line 68b.

A switch 68c for the multiplexer is a switch which selects "the lower side in the drawing of FIG. 8 in a case where the logical value is 1" or "the upper side in the drawing of FIG. 8 in a case where the logical value is 0." As seen in FIG. 8, the signal of "+2 V" (the second voltage) supplied to INP is "the signal with the logical value of 1," and the signal of "−6 V" (the fourth voltage) supplied to INN is "the signal with the logical value of 0." Therefore, since the logical value is 1 as seen in FIG. 8, the fourth voltage (−6 V) supplied to the BLDRV line 68b is supplied to the bit line BL and used for the operation of the memory cell MC.

Figure 9:
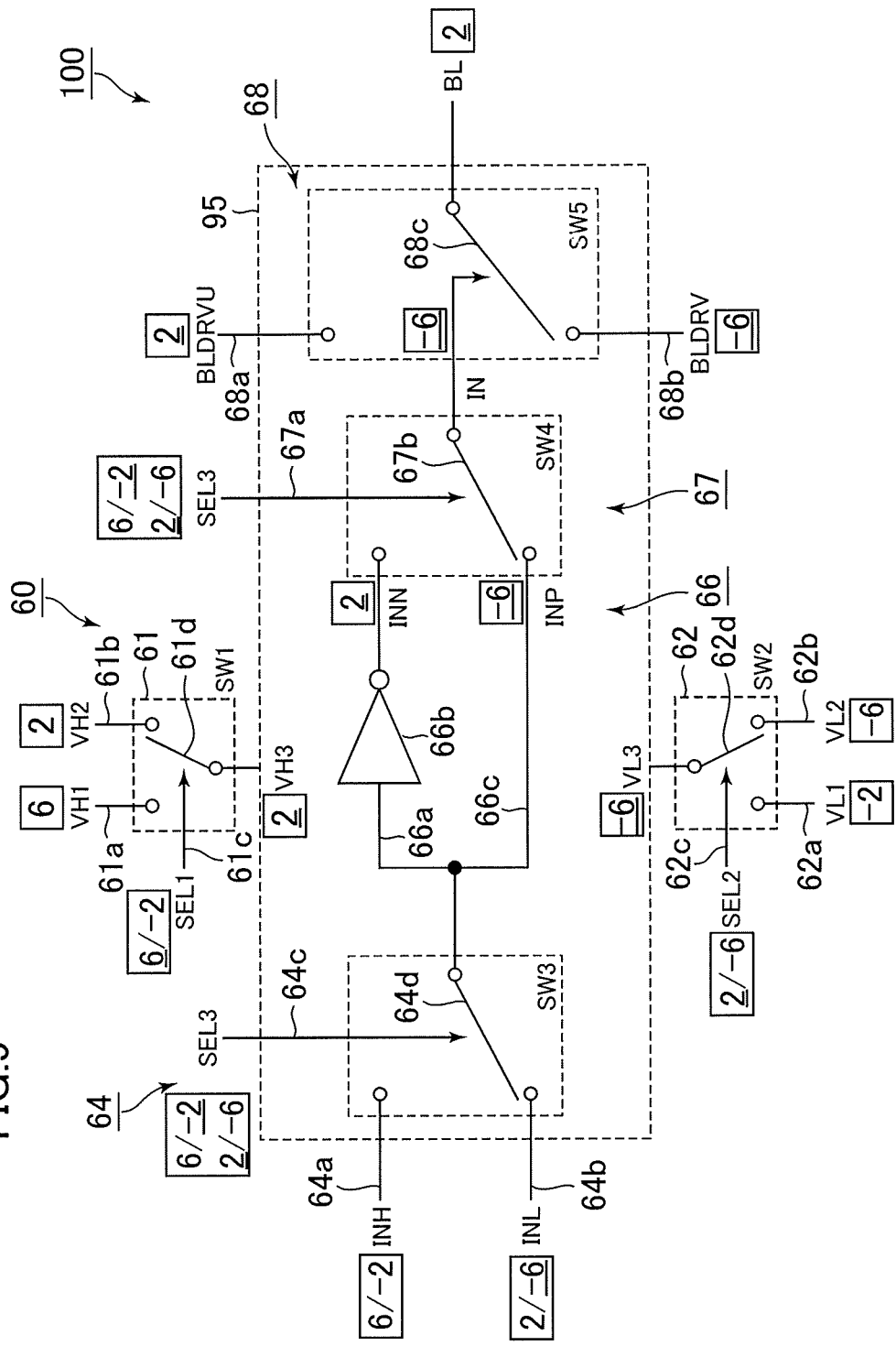
FIG. 9 is one example of the operation in the circuit diagram of the semiconductor device of one aspect of the embodiment.

Next, description is made using FIG. 9. Unlike the case shown in FIG. 8, the fourth voltage (−6 V) is used as the second input signal (INL). Therefore, the fourth voltage (−6 V), which is the second input signal (INL) passed through the first NOT part wire 66a and the INV circuit 66b, becomes the second voltage (+2 V) and is supplied to the portion "INN" in FIG. 9. On the other hand, the fourth voltage (−6 V), which is the second input signal (INL) passed through the second NOT part wire 66c is directly output as the fourth voltage (−6 V) to the portion "INP" in FIG. 9. Therefore, the fourth voltage (−6 V) is supplied to the multiplexer 68. Since it is recognized that the fourth voltage (−6 V) is "the signal with logical value of 0," the second voltage (+2 V) supplied to the BLDRVU line 68a is supplied to the bit line BL and used for the operation of the memory cell MC.

Figure 10:
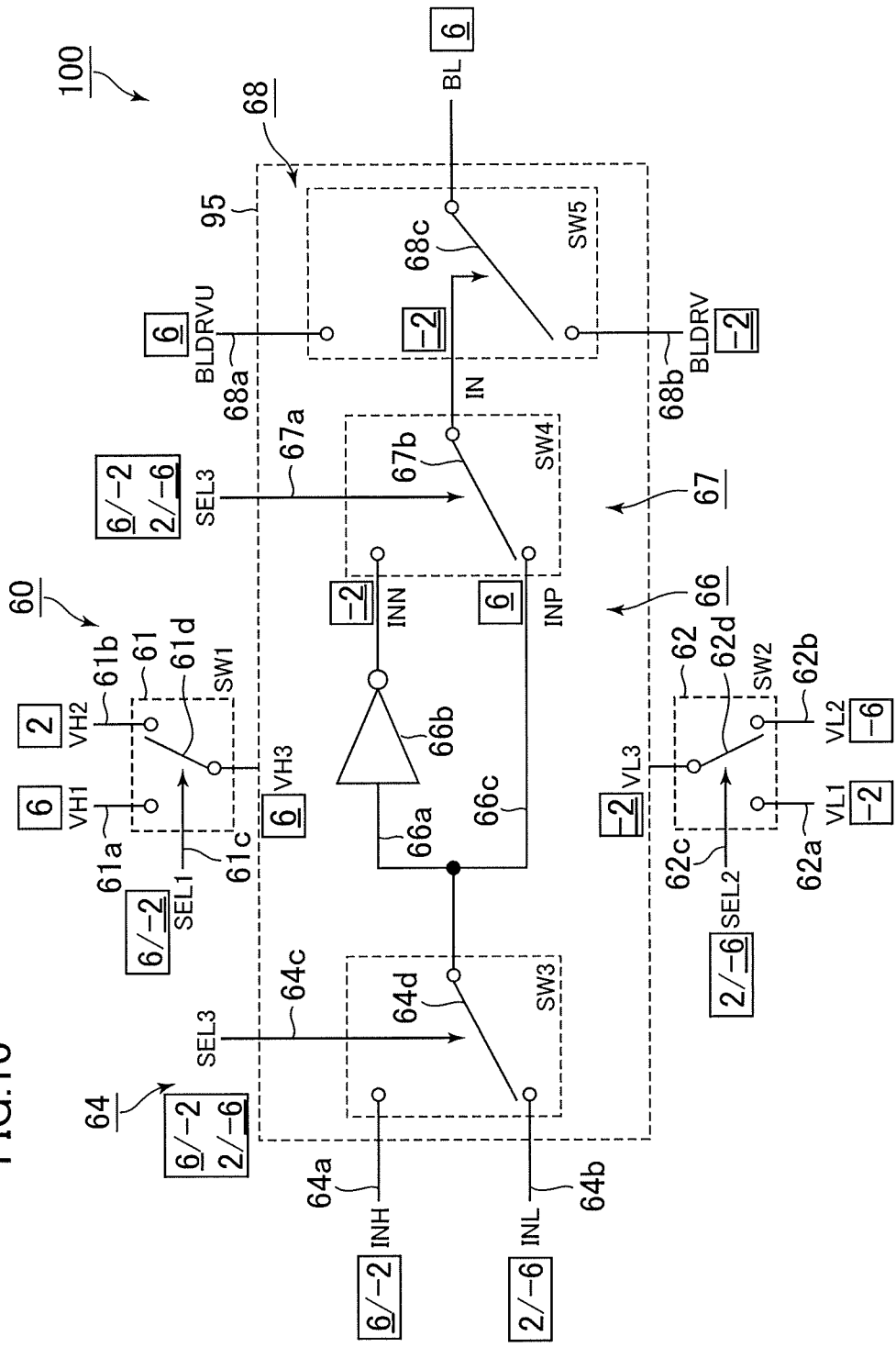
FIG. 10 is one example of the operation in the circuit diagram of the semiconductor device of one aspect of the embodiment.

Description is made using FIG. 10. In FIG. 10, −2 V is selected as the first selection signal (SEL1). Therefore, −2 V is supplied by the first selection signal supply line 61c.

By the signal of −2 V supplied from the first selection signal supply line 61c, the switch 61d for the first well switch selects VH1 (the first voltage, +6 V) from VH1 (the first voltage, +6 V) and VH2 (the second voltage, +2 V). Accordingly, +6 V is supplied as one operating voltage (VH3) of the operation circuit 95.

Moreover, in FIG. 10, −6 V is selected as the second selection signal (SEL2). The signal of −6V is supplied by the second selection signal supply line 62c.

By the signal of −6 V supplied from the second selection signal supply line 62c, the switch 62d for the second well switch selects VL1 (the third voltage, −2 V) from VL1 (the third voltage, −2 V) and VL2 (the fourth voltage, −6 V). Accordingly, −2 V is supplied as one operating voltage (VL3) of the operation circuit 95.

+6 V is supplied as the first input signal (INH). And, the first voltage (+6 V) and the fourth voltage (−6 V) are supplied as the third selection signal (SEL3). Accordingly, the switch 64d for the input switch selects the first input signal (INH).

The first voltage (+6 V), which is the first input signal (INH) passed through the first NOT part wire 66a and the INV circuit 66b of the NOT part 66, becomes the third voltage (−2 V) and is supplied to the portion "INN" in FIG. 10. On the other hand, the first voltage (+6 V), which is the first input signal (INH) passed through the second NOT part wire 66c is directly output as the first voltage (+6 V) to the portion "INP" in FIG. 10.

The fourth selection signal supply line 67a of the output switch 67 supplies the first voltage (+6 V) and the fourth voltage (−6 V), which are the third selection signal (SEL3). Accordingly, the switch 67b for the output switch (SW4) selects "INN." The third voltage (−2V) supplied to "INN" is supplied to the multiplexer 68.

For example, the first voltage (+6 V) is supplied to the BLDRVU line 68a of the multiplexer 68. On the other hand, for example, the third voltage (−2 V) is supplied to the BLDRV line 68b.

As seen in FIG. 10, the signal of "+6 V" (the first voltage) supplied to INP is "the signal with the logical value of 0," and the signal of "−2 V" (the third voltage) supplied to INN is "the signal with the logical value of 1." Therefore, since the logical value is 1 as seen in FIG. 10, the first voltage (+6 V) supplied to the BLDRVU line 68a is supplied to the bit line BL and used for the operation of the memory cell MC.

Figure 11:
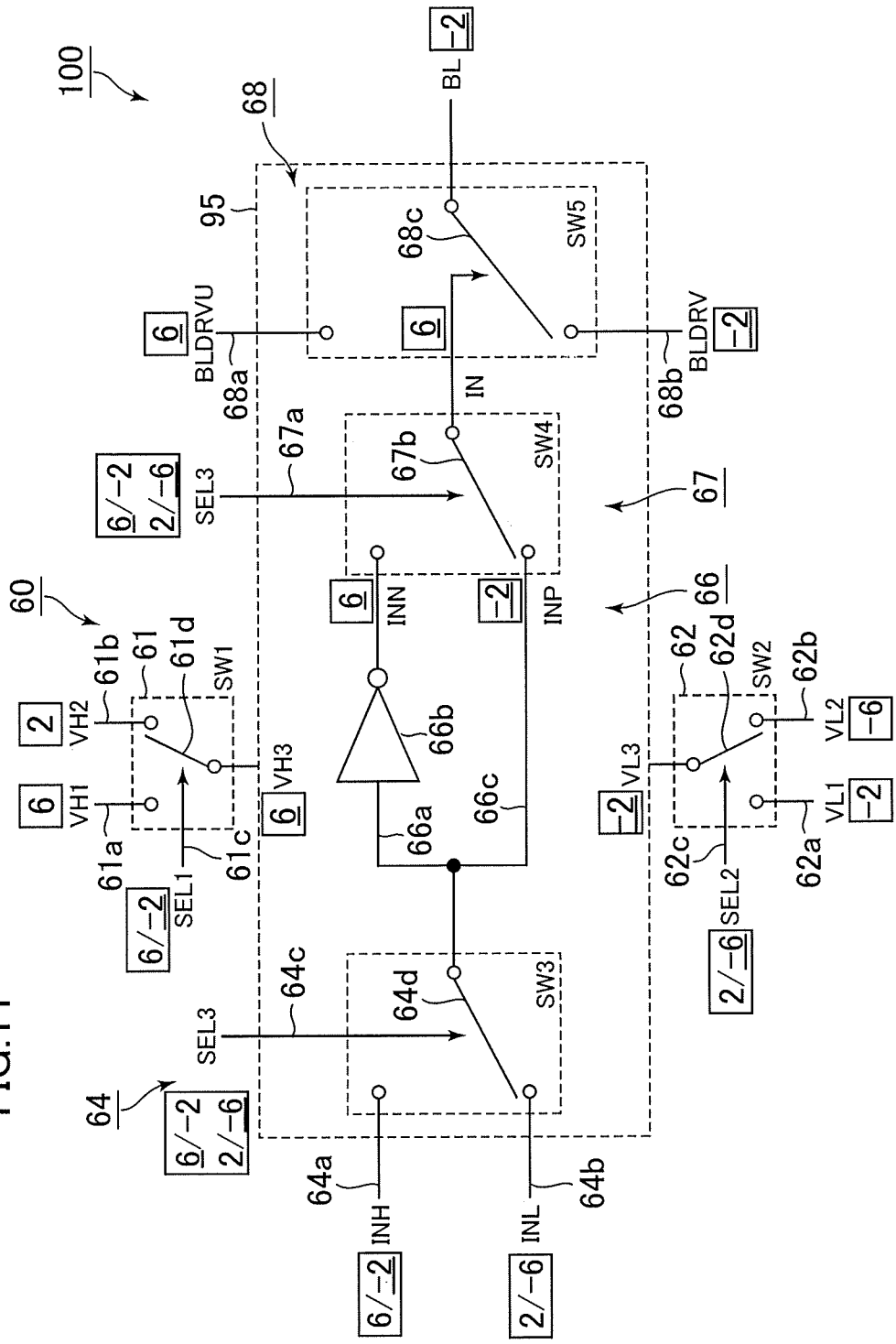
FIG. 11 is one example of the operation in the circuit diagram of the semiconductor device of one aspect of the embodiment.

Next, description is made using FIG. 11. Unlike the case shown in FIG. 10, the third voltage (−2 V) is used as the first input signal (INH). Therefore, the third voltage (−2 V), which is the first input signal (INH) passed through the first NOT part wire 66a and the INV circuit 66b, becomes the first voltage (+6 V) and is supplied to the portion "INN" in FIG. 11. On the other hand, the third voltage (−2 V), which is the first input signal (INH) passed through the second NOT part wire 66c is directly output as the third voltage (−2 V) to the portion "INP" in FIG. 11. Therefore, the first voltage (+6 V) is supplied to the multiplexer 68. Since the first voltage (+6 V) is appreciated as "the signal with logical value of 0," the third voltage (−2 V) supplied to the BLDRV line 68b is supplied to the bit line BL and used for the operation of the memory cell MC.

Figure 12:
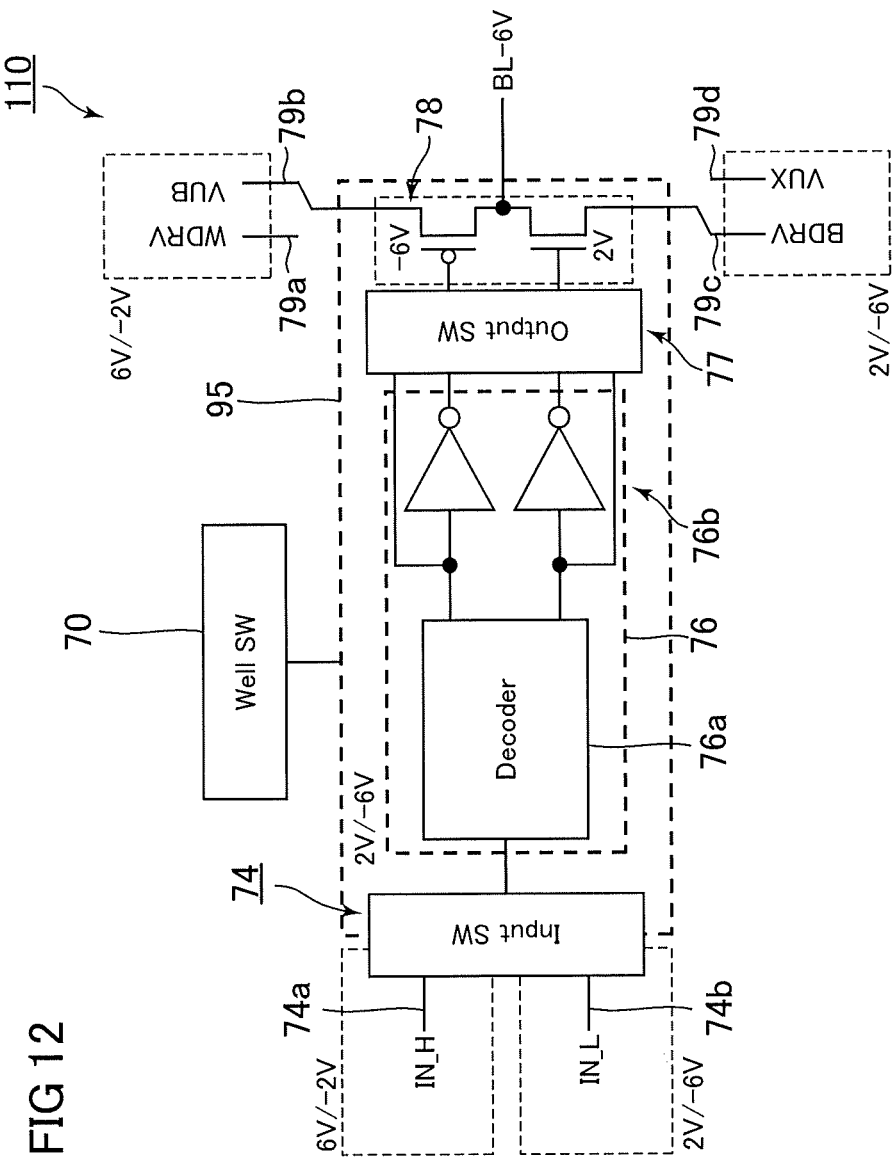
FIG. 12 is a circuit diagram of a semiconductor device of another aspect of the embodiment.

FIG. 12 is a circuit diagram of a semiconductor device 110 of another aspect of the embodiment. The semiconductor device 110 is one supposed a case where there are a plurality of bit lines BL.

Figure 13A:
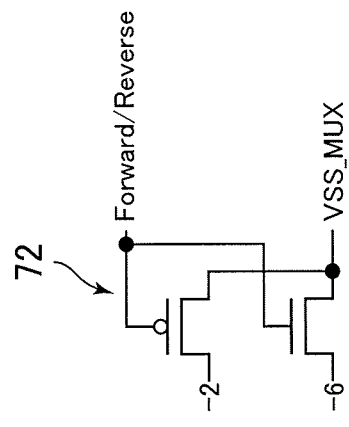
FIGS. 13A to 13C are circuit diagrams of the respective switches used in the semiconductor device according to the embodiment.
Figure 13B:
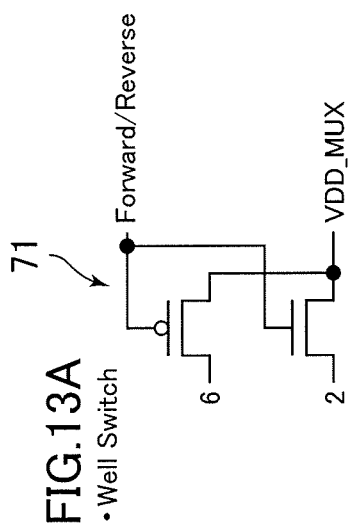
Figure 13C:
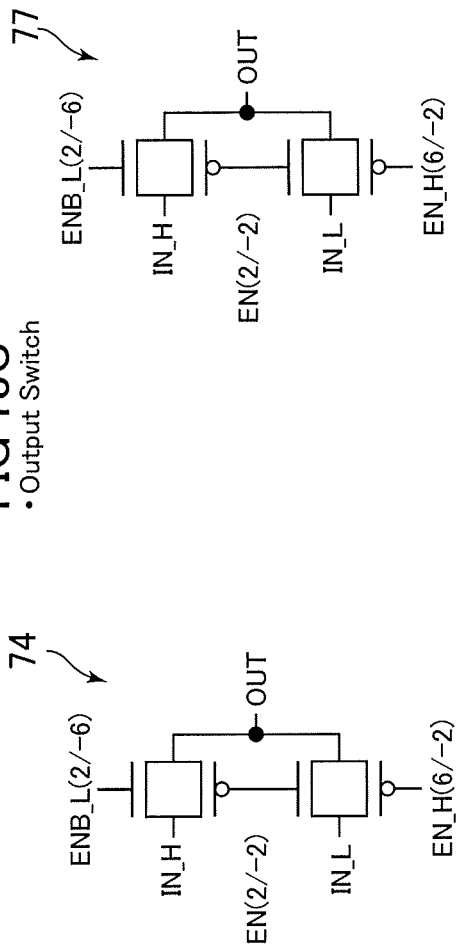

FIGS. 13A to 13C are circuit diagrams of the respective switches used in the semiconductor device according to the embodiment.

The semiconductor device 110 includes a well switch (first switch) 70, an input switch (second switch) 74, a decoder circuit 76, an output switch (third switch) 77 and a multiplexer (fourth switch) 78.

The well switch 70 uses a first selection signal (SEL1) and a second selection signal (SEL2) to select one of a first voltage (+6 V) and a third voltage (−2 V) or a second voltage (+2 V) and a fourth voltage (−6 V) from the first voltage (+6 V), the second voltage (+2 V), the third voltage (−2 V), and the fourth voltage (−6 V) and supplies the voltages to an operation circuit 95. Then, the first selection signal SEL1 is equal to, for example, the first voltage (+6 V) or the third voltage (−2 V), and the second selection signal (SEL2) is equal to, for example, the second voltage (+2 V) or the fourth voltage (−6 V).

In the circuit diagrams of a first well switch circuit 71 and a second well switch circuit 72 shown in FIG. 13A, the first selection signal (Forward/Reverse in FIG. 13A) is supplied to the first well switch circuit 71, and one of the first voltage (+6 V) or the second voltage (+2 V) is selected. Then, the second selection signal (Forward/Reverse in FIG. 13A) is supplied to the second well switch circuit 72, and one of the third voltage (−2 V) or the fourth voltage (−6 V) is selected. Note that the first well switch circuit 71 and the second well switch circuit 72 in FIG. 13A can also be preferably used in the semiconductor device 100 shown in FIGS. 8 to 11.

The input switch 74 selects one of a first input signal (IN_H) or a second input signal (IN_L). The first input signal (IN_H) is supplied from a first input signal supply line 74a, and the second input signal (IN_L) is supplied from the second input signal supply line 74b. Then, the first input signal (IN_H) is the first voltage or the third voltage, and the second input signal (IN_L) is the second voltage or the fourth voltage.

The input switch 74 can be realized by, for example, the circuit diagram shown in FIG. 13B. Note that the input switch 74 in FIG. 13B can also be preferably used in the semiconductor device 100 shown in FIGS. 8 to 11.

The decoder circuit 76 has a decoder 76a and an INV portion 76b. The decoder circuit 76 shown in FIG. 12 is a one-input two-output general-purpose decoder. In a case where the first voltage (+6 V) is input to the decoder 76a from the input switch 74, the decoder 76a outputs the first voltage (+6 V) and the third voltage (−2 V). On the other hand, in a case where the third voltage (−2 V) is input to the decoder 76a from the input switch 74, the third voltage (−2 V) and the first voltage (+6 V) are output.

The voltages output from the decoder 76a are input to the output switch 77 via the INV portion 76b. FIG. 13C is a circuit diagram of the output switch 77.

The signals output by the output switch 77 are input to the multiplexer 78. The multiplexer 78 is, for example, a p-type MOS transistor and an n-type MOS transistor connected in series as shown in FIG. 12.

Accordingly, the first voltage (+6 V), the second voltage (+2 V), the third voltage (−2 V) and the fourth voltage (−6 V) supplied by a WDRV line 79a, a VUB line 79b, a BDRV line 79c and a VUX line 79d can be output to a bit line BL as appropriate. Note that the output switch 77 shown in FIG. 13C can also be preferably used in the semiconductor device 100 shown in FIGS. 8 to 11.

Next, the effects of the semiconductor devices according to the embodiments will be described.

In a bipolar memory that changes the directions of the voltages applied to the memory cells MC by the operation, a wide range of voltages can be preferably applied to the bit lines BL and the word lines WL.

Even in a unipolar memory in which the directions of the voltages applied to the memory cells MC do not change, a wide range of voltages can also be preferably applied to the word lines WL sandwiched between the adjacent bit lines BL or to the bit lines BL sandwiched between the adjacent word lines WL.

Therefore, it is necessary to design the multiplexer MUX provided at the portion closest to the bit lines BL or the word lines WL so as to be able to cope with a high maximum applied voltage. As a method of designing such a multiplexer, for example, means such as connecting a plurality of transistors in series or thickening the gate length to reduce the voltage applied between the source electrode and the drain electrode can be considered. However, these cases have a problem that the circuit area enlarges because the number of transistors increases. Moreover, there is a problem that it is difficult to reduce the voltage between the body and the drain of the transistor used in the multiplexer MUX, which is provided at the portion closest to the bit lines BL and the word lines WL, or the applied voltage between the gate electrode and the drain electrode.

Figure 14:
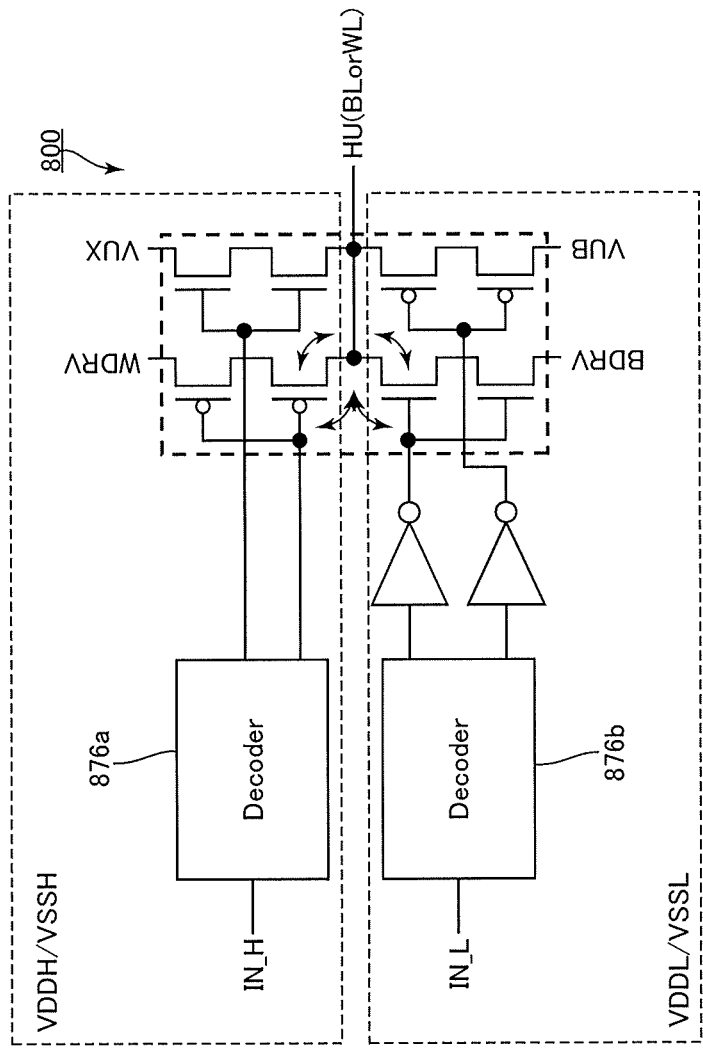
FIG. 14 is a circuit diagram of a semiconductor device according to a comparative embodiment of the embodiments.

FIG. 14 shows a circuit diagram of a semiconductor device 800 according to a comparative embodiment of the embodiments. The semiconductor device 800 outputs VDDH (one example of a first voltage, +6 V), VSSH (one example of a third voltage, −2 V), VDDL (one example of a second voltage, +2 V) and VSSL (one example of a fourth voltage, −6 V). In this case, as decoders, a decoder 876a for VDDH (one example of the first voltage, +6 V) and VSSH (one example of the third voltage, −2 V) and a decoder 876b for VDDL (one example of the second voltage, +2 V) and VSSL (one example of the fourth voltage, −6 V) are used. Therefore, the occupied area increases. Moreover, eight transistors are used as the multiplexer MUX. Therefore, the occupied area further increases. Furthermore, there is a possibility that 12 V which is the maximum difference between the first voltage (+6 V) and the fourth voltage (−6 V) is applied between the body and the drain electrode and between the gate electrodes and the drain electrodes, which are of the connected transistors. Therefore, there is a concern that the transistors can withstand the application of such a high voltage.

Using the well switch, the semiconductor device according to the embodiments selects one of the first voltage (+6 V) and the third voltage (−2 V) or the second voltage (+2 V) and the fourth voltage (−6 V).

Accordingly, the regions (domain) of the voltages at which the transistors operate can be limited between the first voltage (+6 V) and the third voltage (−2 V) or between the second voltage (+2 V) and the fourth voltage (−6 V). Therefore, for example, since the voltage difference is 8V, the voltage applied to the transistors constituting the multiplexer MUX can be lowered.

Moreover, since the number of transistors and the number of decoders can be reduced, the circuit area can be reduced.

In the semiconductor device according to the embodiments, the voltage is switched by using the well switch for the entire semiconductor device. Therefore, the semiconductor device is particularly suitable for setting or resetting many memory cells at once.

Figure 15:
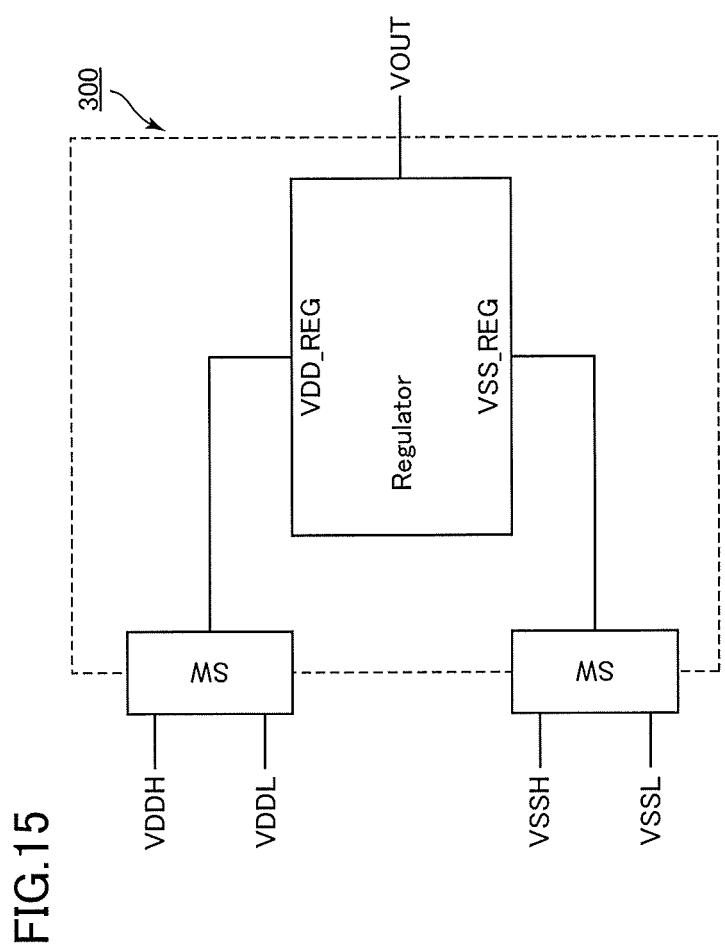
FIG. 15 is a block diagram showing an application example of the semiconductor device (power supply circuit) according to the embodiments.

FIG. 15 is a block diagram showing an application example of the semiconductor device according to the embodiments. FIG. 15 shows a power supply 300. A power supply circuit according to the embodiments is preferably used not only to set or to reset the memory cells MC but also to supply, for example, a voltage (VOUT) between VDDH and VSSH or between VDDL and VSSL.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first switch configured to use a first selection signal and a second selection signal to select one of a first voltage and a third voltage or a second voltage and a fourth voltage from the first voltage, the second voltage lower than the first voltage, the third voltage lower than the first voltage, and the fourth voltage lower than the third voltage;
a second switch configured to select one of a first input signal or a second input signal from the first input signal being the first voltage or the third voltage and the second input signal being the second voltage or the fourth voltage;
a third switch configured to output the third voltage in a case where the first voltage and the third voltage are selected by the first switch and the first input signal as the first voltage is selected by the second switch, to output the first voltage in a case where the first voltage and the third voltage are selected by the first switch and the first input signal as the third voltage is selected by the second switch, to output the second voltage in a case where the second voltage and the fourth voltage are selected by the first switch and the second input signal as the second voltage, is selected by the second switch, and to output the fourth voltage in a case where the second voltage and the fourth voltage are selected by the first switch and the second input signal as the fourth voltage, is selected by the second switch;

a fourth switch configured to output the first voltage in a case where the third voltage is output from the third switch, to output the third voltage in a case where the first voltage is output from the third switch, to output the fourth voltage in a case where the second voltage is output from the third switch, and to output the second voltage in a case where the fourth voltage is output from the third switch; and a control circuit configured to control the first switch, the second switch, the third switch and the fourth switch.

2. The semiconductor device according to claim 1, wherein the third voltage is lower than the second voltage.

3. The semiconductor device according to claim 1, wherein the first selection signal is equal to the first voltage or the third voltage, and the second selection signal is equal to the second voltage or the fourth voltage.

4. The semiconductor device according to claim 1, wherein a p-type MOS transistor and an n-type MOS transistor are connected in series in the fourth switch.

5. The semiconductor device according to claim 1, wherein the first switch comprises:

a first well switch configured to use the first selection signal to supply the first voltage or the second voltage from the first voltage and the second voltage; and a second well switch configured to use the second selection signal to supply the third voltage or the fourth voltage from the third voltage and the fourth voltage.

6. The semiconductor device according to claim 1, wherein the second switch uses a third selection signal to select either the first input signal or the second input signal.

7. The semiconductor device according to claim 6, wherein the third selection signal is the first voltage or the third voltage and the second voltage or the fourth voltage.

8. The semiconductor device according to claim 1, wherein the first switch supplies a voltage for operating the second switch, the third switch, and the fourth switch.

9. The semiconductor device according to claim 1, further comprising a decoder circuit, wherein the decoder circuit supplies the first voltage and the third voltage to the third switch in a case where the first voltage or the third voltage is input from the second switch, and supplies the second voltage and the fourth voltage to the third switch in a case where the second voltage or the fourth voltage is input from the second switch.

* * * * *